(12) United States Patent
Srinivasan et al.

(10) Patent No.: US 9,614,510 B2
(45) Date of Patent: Apr. 4, 2017

(54) INPUT PATH MATCHING IN PIPELINED CONTINUOUS-TIME ANALOG-TO-DIGITAL CONVERTERS

(71) Applicant: Texas Instruments Incorporated, Dallas, TX (US)

(72) Inventors: Venkatesh Srinivasan, Plano, TX (US); Kun Shi, Austin, TX (US); Victoria Wang, Santa Monica, CA (US); Nikolaus Klemmer, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/068,231

(22) Filed: Mar. 11, 2016

(65) Prior Publication Data

US 2016/0269045 A1 Sep. 15, 2016

Related U.S. Application Data

(60) Provisional application No. 62/132,952, filed on Mar. 13, 2015, provisional application No. 62/273,807, filed on Dec. 31, 2015.

(51) Int. Cl.
*H03K 5/159* (2006.01)
*H03M 3/00* (2006.01)
*H03M 1/16* (2006.01)

(52) U.S. Cl.
CPC .............. *H03K 5/159* (2013.01); *H03M 3/37* (2013.01); *H03M 3/38* (2013.01); *H03M 3/386* (2013.01); *H03M 1/164* (2013.01)

(58) Field of Classification Search
CPC ..... H03M 1/0624–1/0626; H03M 1/14–1/145; H03M 3/324; H03M 3/412–3/3416; H03M 3/46

(Continued)

(56) References Cited

U.S. PATENT DOCUMENTS 8,188,901 B1 * 5/2012 Inamdar ................... H03M 3/02
341/133
8,284,085 B2 * 10/2012 Haroun ................. H03M 3/344
341/143

(Continued)

*Primary Examiner* — Howard Williams
(74) *Attorney, Agent, or Firm* — Goutham Kondapalli; Chares A. Brill; Frank D. Cimino

(57) ABSTRACT

System and methods for input path matching in pipelined continuous-time Analog-to Digital Converters (ADCs), including pipelined Continuous-Time Delta Sigma Modulator (CTDSM) based ADCs, includes an input delay circuit disposed in a continuous-time input path from an input of an analog input signal to a first summing circuit of the continuous-time ADC. At least one digital delay line is disposed between an output of an earlier stage sub-ADC (of a plurality of pipelined sub-ADCs) and a sub-digital-to-analog converter (DAC) that is coupled to the first summing circuit, and between the earlier stage sub-ADC and a digital noise cancellation filter. The digital delay line(s) is configured to enable calibration of delay of output of the earlier stage sub-ADC provided to the sub-DAC and the digital noise cancellation filter in accordance with process variations of the input delay match circuit to minimize residue output at first summing circuit.

20 Claims, 6 Drawing Sheets

(58) Field of Classification Search
 USPC .......................................................... 341/156
 See application file for complete search history.

(56) References Cited

U.S. PATENT DOCUMENTS

| | | | | |
|---|---|---|---|---|
| 8,896,475 | B2* | 11/2014 | Shibata ................. | H03M 1/001 |
| | | | | 341/155 |
| 9,000,822 | B2* | 4/2015 | Drake .................... | H03K 5/133 |
| | | | | 327/278 |
| 9,178,529 | B2* | 11/2015 | Dong ..................... | H03M 3/344 |
| 9,312,840 | B2* | 4/2016 | Dong ..................... | H03K 5/159 |
| 2012/0086590 | A1* | 4/2012 | Satarzadeh ............. | H03M 3/38 |
| | | | | 341/120 |

* cited by examiner

US 9,614,510 B2

INPUT PATH MATCHING IN PIPELINED CONTINUOUS-TIME ANALOG-TO-DIGITAL CONVERTERS

CROSS-REFERENCE TO RELATED APPLICATION

This application claims the benefit of U.S. Provisional Patent Application Ser. No. 62/132,952, entitled Input Path Matching in Pipelined Continuous-Time Delta Sigma Modulators, filed Mar. 13, 2015, and U.S. Provisional Patent Application Ser. No. 62/273,807, entitled Input Path Matching in Pipelined Continuous-Time Analog-to-Digital Converters, filed Dec. 31, 2015, both of which are incorporated herein by reference.

BACKGROUND

In pipelined continuous-time Analog-to Digital Converters (ADCs), such as pipelined Continuous-Time Delta Sigma Modulator (CTDSM) based ADCs, the input signal is not typically sampled and held. This causes the residue generation to be in error if the magnitude and phase in a coarse path is not matched in the input signal path for a subsequent stage. The input for a pipelined continuous-time ADC goes through two paths before being subtracted and gained and processed by a second stage. FIG. 1 is a block schematic of prior art first and second stages (102 and 104) of pipelined continuous-time ADC 100. Subsequent pipelined continuous-time ADC stages have similar input paths, feeding from the previous stage. First stage sub-ADC 106 and sub-Digital-to-Analog Converter (DAC) 108 introduce considerable phase delays as the signal passes through. For instance, in an example implementation, first stage sub-ADC 106 and sub-DAC 108, which may be by way of example a four-tap finite impulse response (FIR) filter, or the like, may introduce a delay of approximately three times the systems sample clock. Input (VIN) on a parallel continuous-time input path 110 to summing circuit 112 is relatively un-delayed. Hence, the residue generated by subtracting the output of first stage sub-DAC 108 and the input through path 110 has un-cancelled signal content which upon gain up by amplifier 114 can lead to over-loading second stage sub-ADC 116. Gain at amplifier 114 for input to second stage sub-ADC 116 is obtained by scaling an input voltage to a current via input resistor 118 and subsequently scaling of sub-DAC (108) current. The resulting overloading may be particularly severe at high frequencies, such as are commonly handled by pipelined continuous-time ADCs Integrated Circuits (ICs), particularly, by way of example, in radios employing pipelined CTDSM-based ADC ICs, such as, by way of further example cellular base station radios.

In prior solutions, a "prediction filter" is inserted in the coarse ADC path. FIG. 2 is a block schematic of a prior art implementation 200 of prediction filter 202 in example pipelined continuous-time ADC 100 of FIG. 1. Prediction filter 202 may be an active analog circuit, implemented with multiple active-RC low-Q biquads, which in turn may be implemented using amplifiers. Insertion of prediction filter 202 in coarse, first stage path 102 results in a phase lead for the input to first stage sub-ADC 106 to compensate for delay introduced by the first stage sub-ADC 106 and first stage sub-DAC 108. While non-idealities of the filter do not affect the signal transfer function of first stage sub-ADC 106, the approach is both (IC) circuit area and power intensive.

SUMMARY

Embodiments of the present disclosure provide systems and methods for input path matching in pipelined continuous-time Analog-to-Digital Converters (ADCs) including pipelined Continuous-Time Delta Sigma Modulator (CTDSM) based ADCs. Therein, magnitude and phase of a coarse resolution earlier stage sub-ADC path signal is matched using an input delay circuit disposed in a parallel continuous-time signal path of the pipelined continuous-time ADC.

The input delay circuit may be a passive filter network, which may include at least one low-pass filter and at least one all-pass filter. The low-pass filter(s) may include at least one resistor-capacitor circuit and the all-pass filter(s) may include at least one resistor-capacitor (RC) circuit and/or at least one resistor-inductor-capacitor (RLC) circuit. Alternatively, the input delay circuit may be a digitally controlled delay or the input delay circuit may be a transmission line producing a fixed delay.

In accordance with some aspects, process variations in the input delay match circuit may be adjusted for using at least one digital delay chain disposed in the coarse resolution path and delay in the coarse resolution path may be calibrated using the digital delay chain(s) disposed in the coarse resolution path to minimize residue.

Hence, a resulting input path matching system for pipelined continuous-time ADCs, including pipelined CTDSM-based ADCs, includes an input delay circuit disposed in a continuous-time input path from an input of an analog input signal to a first summing circuit of the continuous-time ADC.

In accordance with some aspects, at least one digital delay line may be disposed between an output of an earlier stage sub-ADC (of a plurality of pipelined sub-ADCs) and a sub-digital-to-analog converter (DAC) that is coupled to the first summing circuit, and between the earlier stage sub-ADC and a digital noise cancellation filter. The digital delay line(s) may be configured to be used to calibrate delay of the output of the earlier stage sub-ADC provided to the sub-DAC and the digital Noise Cancellation Filter (NCF) in accordance with process variations of the delay generated by the input delay circuit. This serves to minimize residue output at the first summing circuit.

Thus, a resulting pipelined continuous-time ADC device, or pipelined CTDSM-based ADC that includes an earlier stage sub-ADC (of a plurality of pipelined sub-ADCs), wherein the earlier stage sub-ADC is configured to receive an analog input signal and a continuous-time input path is configured to receive the analog input signal, the continuous-time input path includes an input delay circuit.

In accordance with some aspects, at least one digital delay line may be coupled to an output of the earlier stage sub-ADC. This digital delay line(s) may be configured to be used to calibrate delay of output of the earlier stage sub-ADC in accordance with process variations of the delay generated by the input delay match circuit to minimize residue. A digital NCF and a sub-DAC may be coupled to output of the digital delay line(s). Therein, the first summing circuit may be configured to receive the analog input signal via the continuous-time input path and the input delay circuit. The first summing circuit may also be coupled to an output of the sub-DAC, and the first summing circuit determines a difference between the analog input signal and a delayed output signal from the earlier stage sub-ADC provided to the first summing circuit via the sub-DAC.

The device may further include a subsequent stage sub-ADC of the plurality of pipelined sub-ADCs coupled to an output of the amplifier. The second summing circuit may be configured to receive the digital output of the digital NCF and the subsequent stage sub-ADC to provide a digital device output.

As noted, the pipelined continuous-time ADC (device) may be a pipelined CTDSM (based device), which may be an Integrated Circuit (IC). Therein the earlier stage and subsequent stage sub-ADCs are an earlier stage and subsequent stage sub-delta sigma modulators (DSMs) of a plurality of pipelined sub-DSMs

BRIEF DESCRIPTION OF THE DRAWINGS

Figure 1:
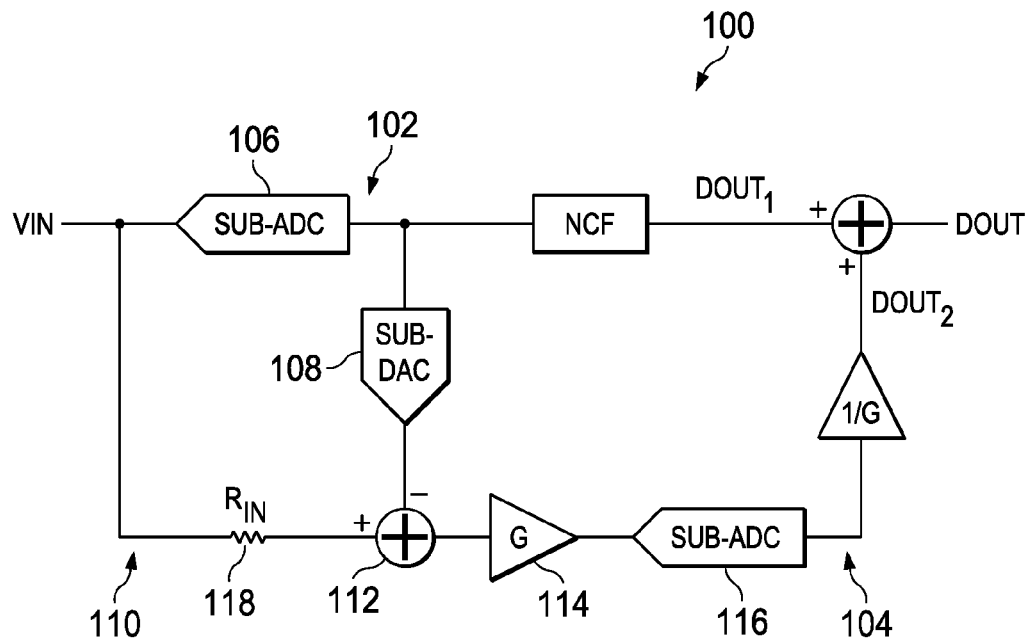
Figure 2:
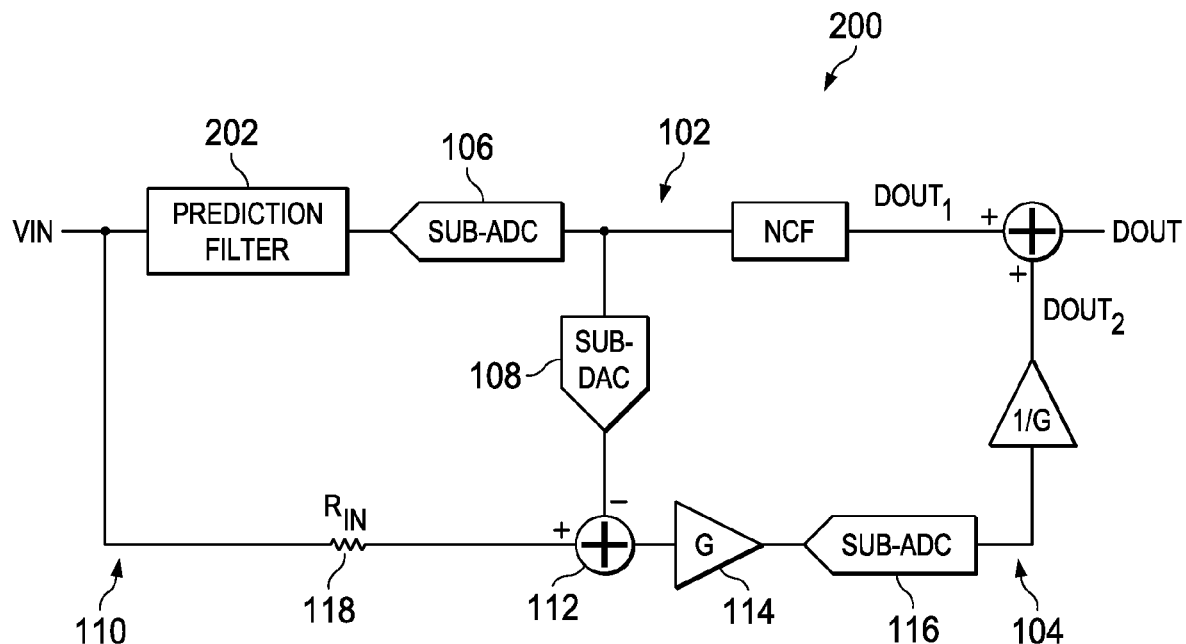
Figure 3:
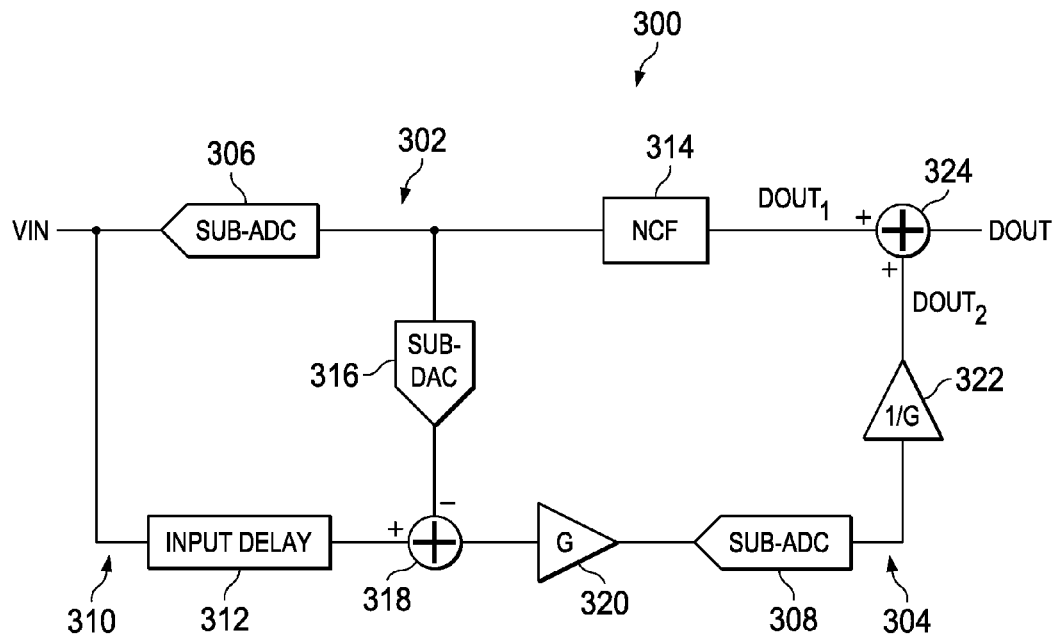
Figure 4:
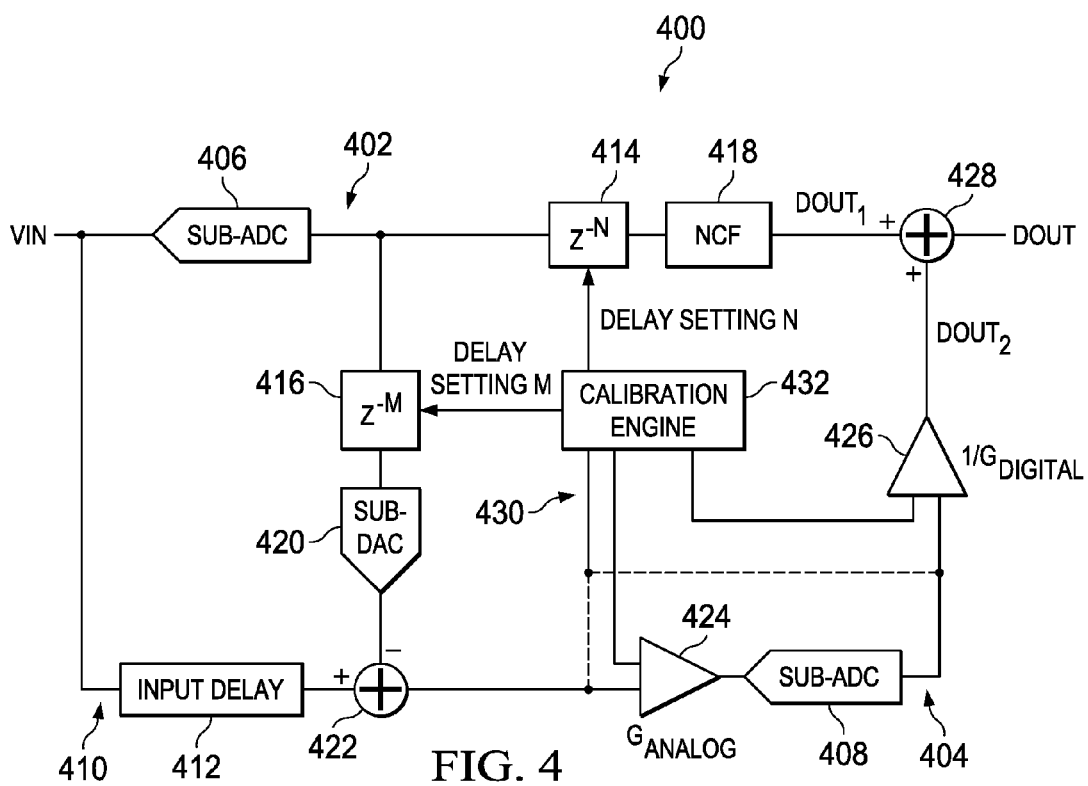
Figure 5:
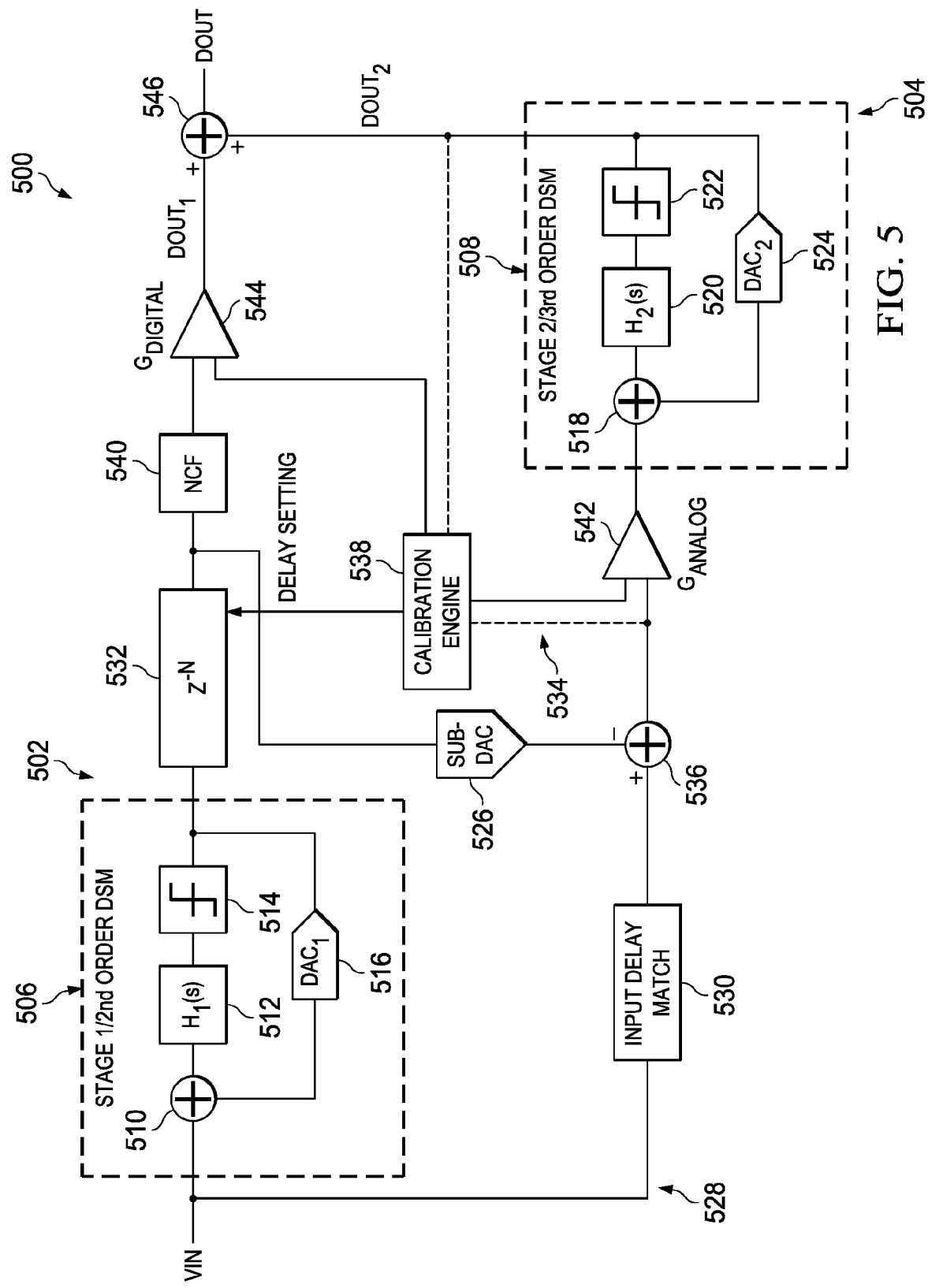
Figure 6:
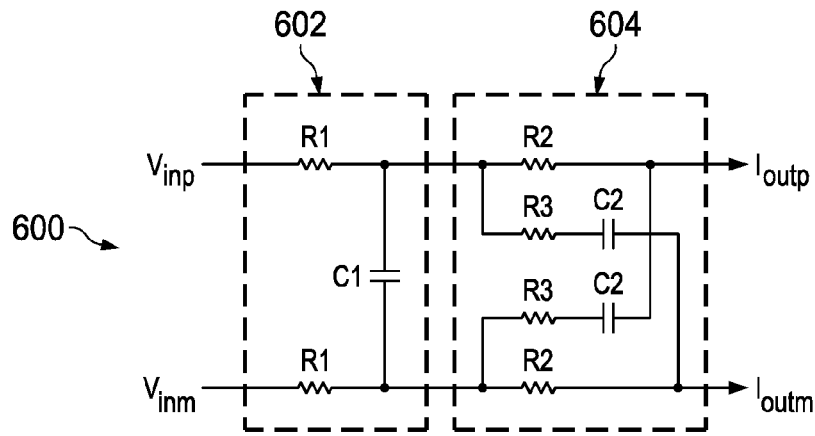
Figure 7:
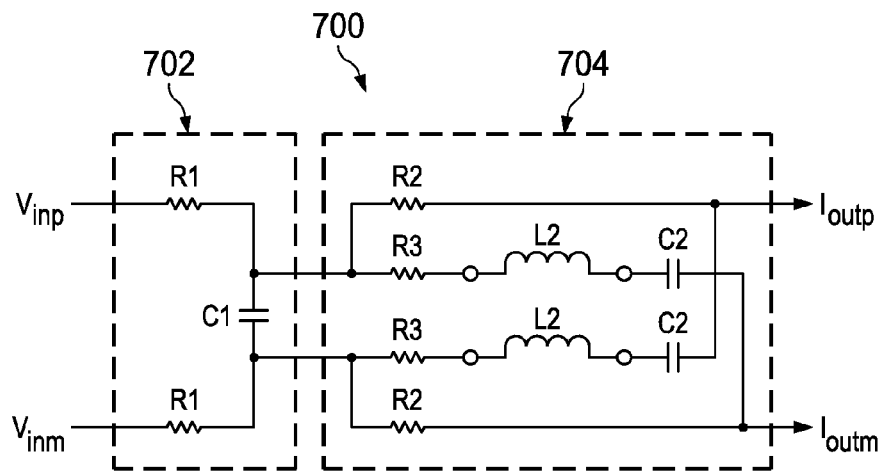
Figure 8:
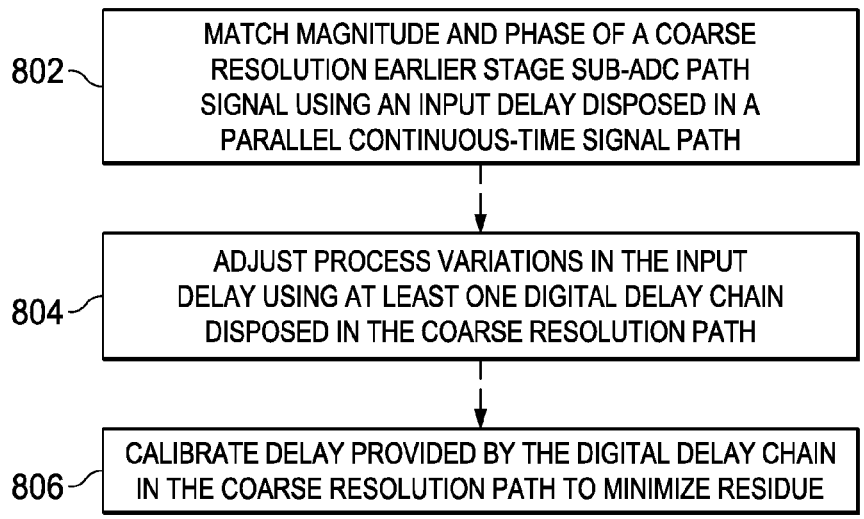
Figure 9:
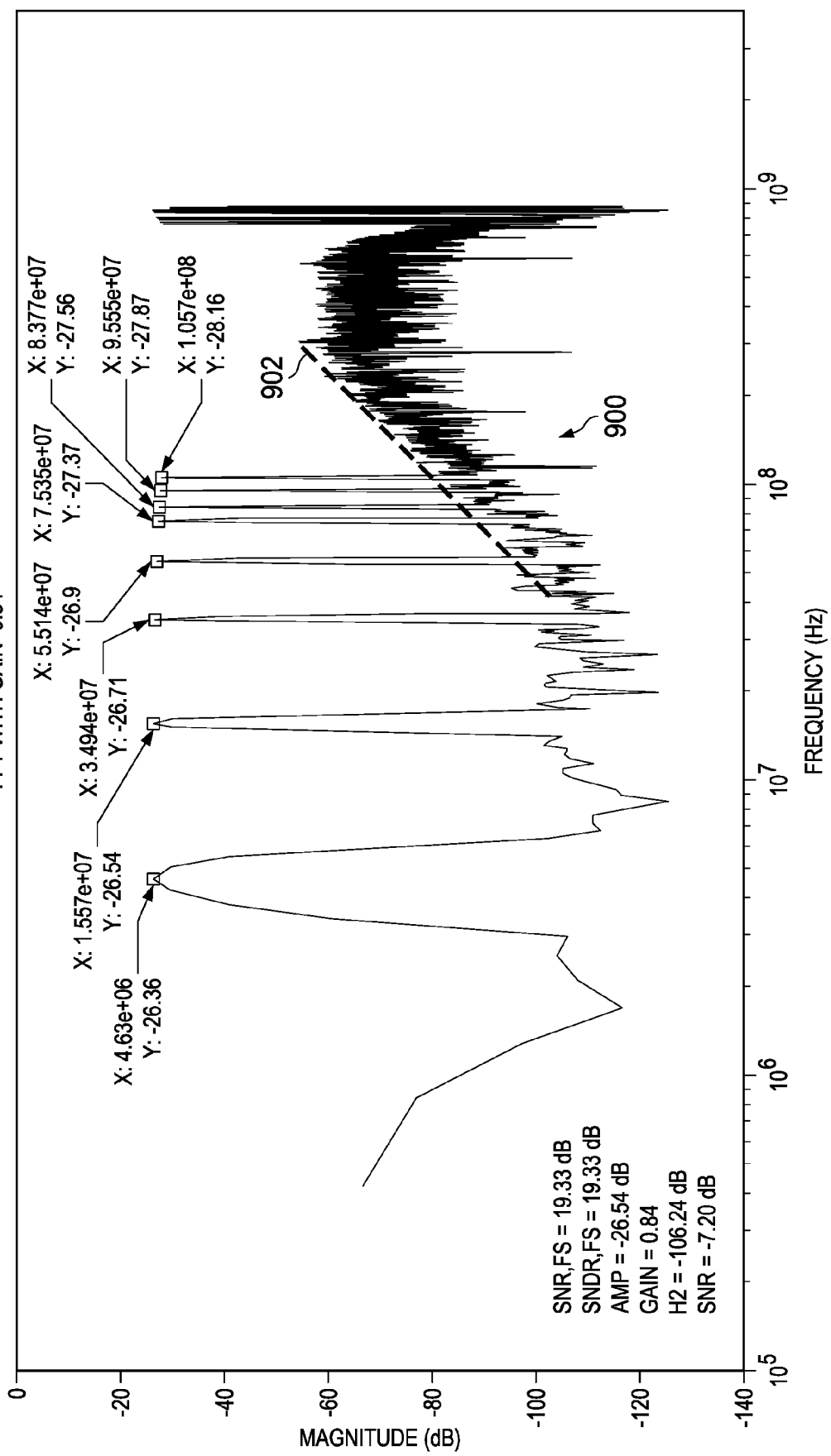
Figure 10:
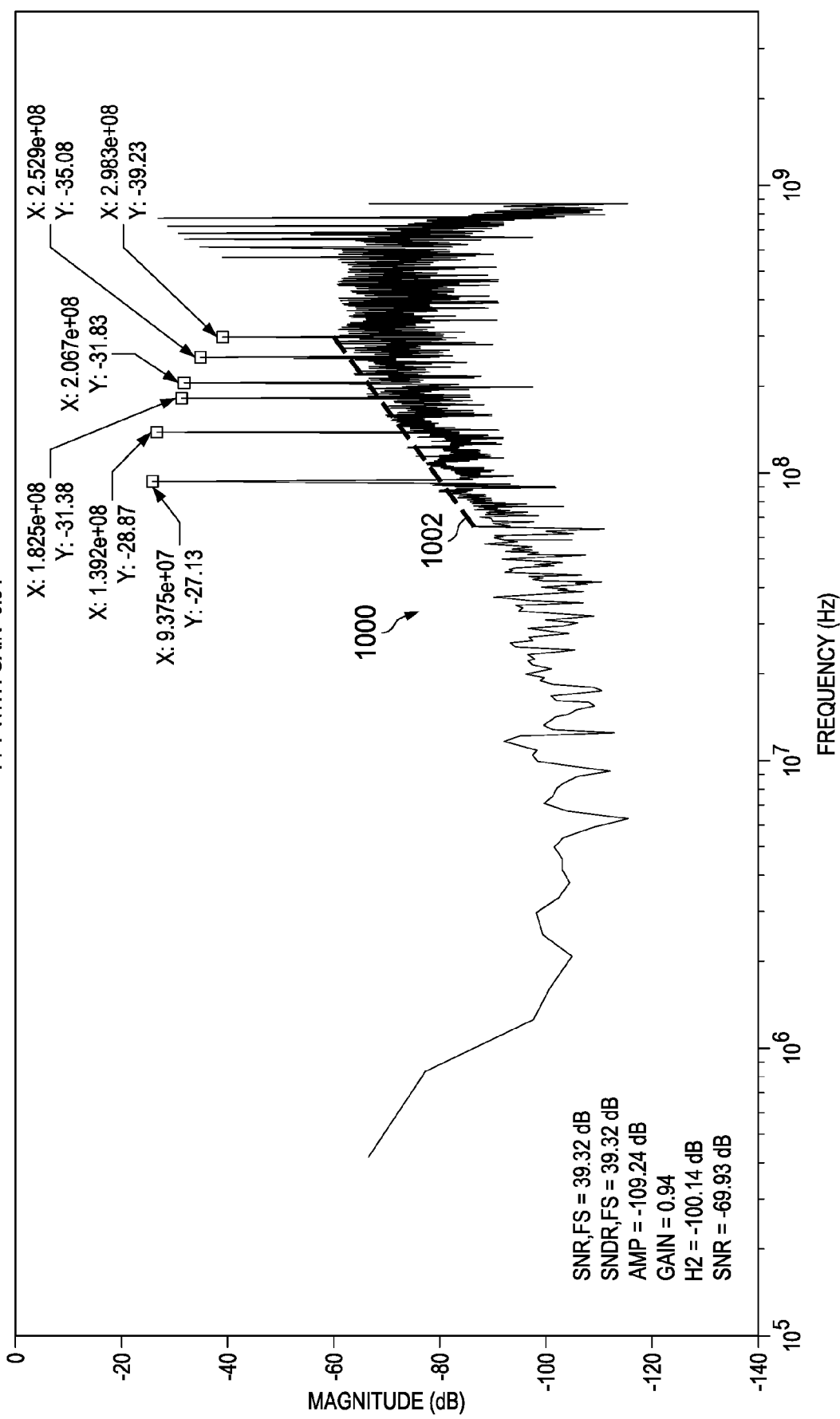

Having thus described the present systems and methods in general terms, reference will now be made to the accompanying drawings, wherein:

FIG. 1 is a block schematic of example prior art first and second stages of a pipelined continuous-time Analog-to-Digital Converter (ADC);

FIG. 2 is a block schematic of an example prior art implementation of a prediction filter in the example pipelined continuous-time ADC of FIG. 1;

FIG. 3 is a block schematic of an example first and second stages of a pipelined continuous-time ADC device implementing an example of input path matching, in accordance with some embodiments;

FIG. 4 is a block schematic of example first and second stages of a pipelined Continuous-Time Delta Sigma Modulator (CTDSM) device implementing an example of input path matching, in accordance with some embodiments;

FIG. 5 is a block schematic of example first and second stages of a pipelined CTDSM device implementing another example of input path matching, in accordance with some embodiments;

FIG. 6 is a schematic of example combination low-pass and first order all-pass filter network for implementation in a continuous-time input path of a pipelined continuous-time ADC for input path matching, in accordance with some embodiments;

FIG. 7 is a schematic of another example combination low-pass and second order all-pass filter network for implementation in a continuous-time input path of a pipelined continuous-time ADC for input path matching, in accordance with some embodiments;

FIG. 8 is a flowchart of an example implementation of input path matching in a pipelined continuous-time ADC in accordance with some embodiments;

FIG. 9 is a graph of in-band frequency response for a 0.4 Vpp combined input signal in a pipelined continuous-time ADC implementing the present systems and methods for input path matching, in accordance with some embodiments; and FIG. 10 is a graph of in-band frequency response for a 0.3 Vpp combined input signal in a pipelined continuous-time ADC implementing the present systems and methods for input path matching, in accordance with some embodiments.

DETAILED DESCRIPTION

The techniques of this disclosure now will be described more fully hereinafter with reference to the accompanying drawings. These techniques may, however, be embodied in many different forms and should not be construed as limited to the embodiments set forth herein. Rather, these embodiments are provided so that this disclosure will be thorough and complete, and will fully convey the scope of this disclosure to those skilled in the art. One skilled in the art may be able to use the various embodiments described herein.

The present systems and methods for input path matching in pipelined continuous-time Analog-to-Digital Converters (ADCs), such as Continuous-Time Delta Sigma Modulator (CTDSM) based ADCs. Magnitude and phase in a coarse resolution first stage path and a continuous-time input path in a pipelined continuous-time ADC is matched using a passive filter network that is inserted in the continuous-time signal input path. Process variations in the filter network are adjusted to, via a digital delay chain or line that is inserted in the coarse resolution first stage path. The delay from the coarse resolution first stage path is then calibrated such that residue is minimized. Use of a passive filter network, such as a Resistor-Capacitor (RC) and/or resistor-inductor-capacitor (RLC) filter network, occupies less circuit area and consumes less power and is therefore more cost effective than typical solutions.

Thus, in accordance with the present systems and methods a pipelined continuous-time ADC input resistor may be replaced with a combination of low-pass and all-pass filter network. The process variations of this network may then be calibrated for via a digital delay line introduced into the first stage path, providing a passive, low-power approach to input path matching for the pipelined continuous-time ADC.

FIG. 3 is a sub-ADC block schematic of example first and second stages 302 and 304 of pipelined continuous-time ADC device 300 implementing an example of input path matching, in accordance with some embodiments of the present systems and methods. Example pipelined continuous-time ADC 300 is a two-stage pipelined continuous-time ADC. However, pipelined continuous-time ADC 300, or the like, can be scaled to include more stages. Therefore, an earlier stage ADC, such as "first" sub-ADC 306, of a plurality of pipelined continuous-time ADCs, may be referred to herein as an "earlier stage" continuous-time ADC. A later continuous-time ADC of the plurality of pipelined continuous-time ADCs, such as illustrated "second" sub-ADC 308, may be referred to herein as a "subsequent stage" continuous-time ADC. In this example, pipelined continuous-time ADC 300 generally comprises earlier stage and subsequent stage sub-ADCs 306 and 308. Earlier stage sub-ADC 306 is configured to receive an analog input signal (VIN). Continuous-time input path 310 is also configured to receive the analog input signal (VIN). Also, continuous-time input path 310 includes an input delay circuit 312. In accordance with some embodiments of the present systems and methods, input delay circuit 312 may take the form of, or may include, a passive filter network, a transmission line that produces a fixed delay, and/or a digitally controlled delay.

Illustrated pipelined continuous-time ADC 300 further generally comprises digital Noise Cancellation Filter (NCF) 314 coupled to an output of earlier stage sub-ADC 306. NCF 314 ensures that amplitude and phase characteristics of the to-be-cancelled noise are aligned between first and second stages 302 and 304 of pipelined continuous-time ADC device 300. Sub-Digital-to-Analog Converter (Sub-DAC) 316 may also be coupled to an output of sub-ADC 306. First summing circuit 318 is configured to receive the analog input signal (VIN), via continuous-time input path 310, after it has passed through input delay circuit 312. First summing circuit 318 is further coupled to an output of Sub-DAC 316. First summing circuit 318 is further configured to determine a difference between the filtered analog input signal and an output analog signal from Sub-DAC 316.

Pipelined continuous-time ADC 300 further generally comprises amplifier 320 coupled to an output of first summing circuit 318. Subsequent stage sub-ADC 308 is coupled to an output of amplifier 320. Digital gain block that produces an inverse gain (1/G) 322 is coupled to an output of subsequent stage sub-ADC 308. Second summing circuit 324 is coupled to an output of inverse gain block 322. Second summing circuit 324 is configured to receive digital outputs from digital NCF 314 and inverse gain block 324 ($DOUT_1$ and $DOUT_2$, respectively) and sum them to provide a digital device output (DOUT). However, the inverse gain 1/G, such as illustrated as provided by digital gain block 322 can be implemented as a gain (G) in series with NCF 314, and in such a case, second summing circuit 324 may be configured to receive a gained-up digital output from digital NCF via a gain amplifier and an output of sub-DAC 308 and sum them to provide a digital device output.

Amplifiers 320 and 322 can take on many forms, including but not limited to voltage-to-voltage amplifiers (i.e., operational amplifiers), voltage-to-current amplifiers with a current gain (i.e., transconductance amplifiers or variable resistors), current-to-voltage amplifiers (i.e., transimpedance amplifiers), or current-to-current amplifiers (i.e., current mode amplifiers having a topology that depends on the amplifier input signal). For example, in accordance with some implementations the gain may be achieved in the current-domain by scaling an input resistor $R_1$ and the full-scale current of Sub-DAC 316.

A passive filter network defining input delay circuit 312 may include, as discussed below in greater detail, at least one low-pass filter and at least one all-pass filter to substantially match the combined SUB-ADC and SUB-DAC transfer characteristic between VIN and the summing element. The low-pass and all-pass filters may each be at least one resistor-capacitor circuit, or the low-pass filter(s) may be a resistor-capacitor circuit(s) and the all-pass filter(s) may be resistor-inductor-capacitor circuit(s). Alternatively, input delay circuit 312 may be a digitally controlled delay, wherein resistance capacitance and/or inductance may be tuned to provide a desired matching delay for continuous-time input path 310. Further, as mentioned, the input delay circuit may take the form of, or may include, a transmission line that produces a fixed delay. Such a transmission line-based delay may be placed in series with a conventional input resistor (118), or the like.

FIG. 4 is a sub-ADC block schematic of example first and second stages 402 and 404 of pipelined continuous-time ADC device 400 implementing an example of input path matching, in accordance with some embodiments of the present systems and methods. Example pipelined continuous-time ADC 400 is a two-stage pipelined continuous-time ADC that includes earlier stage sub-ADC 406, and subsequent stage sub-ADC 408, of a plurality of pipelined continuous-time ADCs. Earlier stage sub-ADC 406 is configured to receive an analog input signal (VIN). Continuous-time input path 410 is also configured to receive the analog input signal (VIN). Also, continuous-time input path 410 includes a passive filter network, or the like defining input delay circuit 412. In accordance with some embodiments of the present systems and methods, input delay circuit 412 may take the form of, or may include, a transmission line that produces a fixed delay. Regardless, at least one digital delay line or chain (414, 416) is coupled to an output of earlier stage sub-ADC 406. The digital delay line(s) is configured to enable calibration of delay of output from earlier stage sub-ADC 406 in accordance with process variations of the delay generated a passive filter network, or the like defining input delay circuit 412 to minimize residue.

In the illustrated example, pipelined continuous-time ADC 400 further generally comprises digital NCF 418 coupled to an output of the at least one digital delay line (414). NCF 418 ensures that amplitude and phase characteristics of the to-be-cancelled noise are aligned between first and second stages 402 and 404 of pipelined continuous-time ADC device 400. Sub-Digital-to-Analog Converter (Sub-DAC) 420 may be coupled to another output of the at least one digital delay line (416) and may contribute to the delay in the coarse resolution path through sub-ADC 406. First summing circuit 422 is configured to receive the analog input signal (VIN), via continuous-time input path 410, after it has passed through input delay circuit 412. First summing circuit 422 is further coupled to an output of Sub-DAC 420. First summing circuit 422 is further configured to determine a difference between the filtered analog input signal and an output analog signal from Sub-DAC 420.

Pipelined continuous-time ADC 400 further generally comprises amplifier 424 coupled to an output of first summing circuit 422. Subsequent stage sub-ADC 408 is coupled to an output of amplifier 424. Digital gain block that produces an inverse gain (1/G) 426 is coupled to an output of subsequent stage sub-ADC 408. Second summing circuit 428 is coupled to an output of inverse gain block 426. Second summing circuit 428 is configured to receive digital outputs from digital NCF 418 and inverse gain block 426 ($DOUT_1$ and $DOUT_2$, respectively) and sum them to provide a digital device output (DOUT). However, the inverse gain 1/G, such as illustrated as provided by digital gain block 426 can be implemented as a gain (G) in series with NCF 418, and in such a case, second summing circuit 428 may be configured to receive a gained-up digital output from digital NCF via a gain amplifier and an output of sub-DAC 408 and sum them to provide a digital device output.

Digital delay line(s) 414, 416 may be configured to be used to calibrate delay of output of earlier stage sub-ADC 406 in accordance with process, voltage, temperature and/or the like. Digital delay line(s) 414, 416 may be comprised of a series of flip-flop circuits, or the like, providing blocks of delay. Regardless, digital delay line(s) 414, 416 are each discrete elements, which allows a signal to be delayed by a number of samples. If the delay is an integer multiple of samples, digital delay line(s) 414, 416 may be implemented as shift registers. Thereby integer delays can be computed very efficiently. Delays of N or M samples is notated as $z^{-N}$ or $z^{-M}$ (e.g. see digital delay lines 414 and 416, respectively, in FIG. 4) for example, a delay by one sample is notated as $z^{-1}$. The digital delays introduced by digital delay lines 414 and 416 may not be the same. That is, delays $z^{-N}$ and $z^{-M}$ (i.e. M and N) may or may not be the same. If a delay is not an integer of a sample, additional filters may be applied to account for the fraction of delay different from an integer. Hence, delay lines with non-integer delay are called fractional delay lines. An alternate implementation may employ a single digital delay line coupled to an output of Sub-ADC 406 (in place of illustrated digital delay lines 414, 416). The output of this single digital delay line feeds both the NCF 418 and Sub-DAC 420. This may be more efficient in terms of silicon area in an IC, or the like in that only one delay block is employed. Regardless, digital delay line(s) 414, 416 may be controlled via calibration loop 430, which may, as optionally illustrated, employ an output of first summing circuit 422 as input to digital delay line(s) 414, 416, so as to maintain residue output of first summing circuit 422 to a minimum. However, as also optionally illustrated, calibration loop 430 may be implement by tapping output of the Sub-ADC 408. Digital delays M and N may be calibrated as stated using a calibration engine (432) or the like, by way of example. This calibration engine may only execute once during initial (factory) calibration of circuit 400 (and the results stored), may execute on startup of circuit (IC) 400 (such as, if there is no storage), and in highly accurate embodiments of circuit 400 (i.e. occasionally during operation to compensate for drift). Output of calibration engine 432 is provided to digital delay lines 414 and 416, as delay settings (reflecting M and N) or the like.

Calibration engine 432 may also provide calibration for the digital gain block 1/G 426 relative to analog output amplifier 424, such that they are matched. Calibration engine 432 may control digital gain block 1/G 426 to become equal to analog output amplifier 424. For example, programmable gain of gain block 426 and the gain of amplifier 424 may be equalized in repose to input from from calibration engine 432. Thereby, transfer function of the first and second stages 402 and 404 (i.e. a frequency dependent function) may be matched, via factoring out gain, via delay (frequency independent), and frequency response separately.

Digital sample delays, provided such as via digital delay lines 414 and 416, may be used in accordance with embodiments of the present systems and methods because sampling clock periods in sub-ADCs 406 and 408 and sub-DAC 420 are small compared to periods of input (VIN) signals passing through signal paths 402 and 404. For example, if ADC 400 is designed for an oversampling rate of thirty-two, the sampling clock period is one sixty-fourth of the period of the highest frequency signal. This allows for very good adjustment (~1.5% period error) which does not lead to any signal peaking, thereby avoiding over-loading second stage sub-ADC 408.

FIG. 5 is a block schematic of example first and second stages 502 and 504 of a pipelined Continuous-Time Delta Sigma Modulator (CTDSM) device 500 implementing an example of input path matching, in accordance with some embodiments. In accordance with various embodiments, earlier stage Delta-Sigma Modulator (DSM) 506 may generally comprise summing circuit 510, DSM filter 512, quantizer 514, and $DAC_1$ 516. Subsequent stage DSM 508 may generally comprise summing circuit 518, DSM filter 520, quantizer 522, and $DAC_2$ 524. Also, earlier stage DSM 506 can be a lower order modulator (i.e., order of 1 or 2), While subsequent stage DSM 508 can be a higher order modulator (i.e., order greater than 3) such as with aggressive noise shaping.

Magnitude and phase in the coarse resolution first stage path comprising earlier stage DSM 506 and sub DAC 526 and continuous-time input path 528 in pipelined CTDSM 500 is also matched using input delay circuit 530, which may take the form of a passive filter network, which is disposed in continuous-time signal input path 528. Process variations of the delay generated by passive filter network 530 are adjusted to, via digital delay chain or line(s) 532 disposed in the coarse resolution first stage path of earlier stage DSM 506. The delay from the coarse resolution first stage path is then calibrated such as via calibration loop 534, such that residue monitored at the output of first summing circuit 536, or at output of second stage 504, is minimized. Calibration loop 534 may, as optionally illustrated, employ an output of first summing circuit 536 as input to digital delay line(s) 532. However, as also optionally illustrated, calibration loop 534 may be implement by tapping output of the Sub-ADC 526.

Digital delay N may be calibrated as stated using a calibration engine (538) or the like, by way of example. This calibration engine may only execute once during initial (factory) calibration of circuit 500 (and the results stored), may execute on startup of circuit (IC) 500 (such as, if there is no storage), and in highly accurate embodiments of circuit 500 (i.e. occasionally during operation to compensate for drift). Output of calibration engine 538 is provided to digital delay line 532, as delay settings (reflecting delay N) or the like.

A passive filter network defining input delay circuit 530 may also include at least one low-pass filter and at least one all-pass filter, or be a digitally controlled delay. Digital delay line(s) 532 may also be configured to be used to calibrate delay of earlier stage sub-DSM 506 in accordance with process, voltage, temperature and/or the like. Digital delay line 532 is illustrated as coupled to an output of earlier stage sub-DSM 506. The output of this single digital delay line feeds both the NCF 540 and Sub-DAC 526. This may be more efficient in terms of silicon area in an IC, or the like in that only one delay block is employed. However, an alternate implementation, may, similar to implementation 400 of FIG. 4, employ two digital delay lines, one disposed between an output of earlier stage sub-DSM 506 sub-DAC 526 and another disposed between earlier stage sub-DSM 506 and NCF 540. Regardless, digital delay line(s) 532 may also be comprised of a series of flip-flop circuits, or the like, providing blocks of delay. Digital delay line(s) 532 is also a discrete element, which allows a signal to be delayed by a number of samples. Again, NCF 540 ensures that amplitude and phase characteristics of the to-be-cancelled noise are aligned between first and second stages 502 and 504 of pipelined continuous-time ADC device 300.

Pipelined CTDSM device 500 may further generally comprise first gain amplifier 542 coupled to an output of first summing circuit 536. However, with implementation of input delay circuit 530 (or 512), particularly as a passive RC and/or RLC circuit, first gain amplifier 542 (or 524) may not be used, in that traditionally this gain for input to a second stage sub-ADC is obtained by scaling an input voltage to a current via an input resistor, replaced in accordance with the present systems and methods, by input delay circuit or 530 (or 512) and subsequently scaling of the sub-DAC current. Such scaling of the input and subsequently scaling of the sub-DAC current may not be necessary upon implementation of input path matching in accordance with the present systems and methods.

Subsequent stage DSM 508 may be coupled to an output of first summing circuit 536 (such as via first gain amplifier 542). Second gain amplifier 544 may be implemented in series w/NCF 540. Second summing circuit 546 may be configured to receive a gained-up digital output from digital NCF 540, via second gain amplifier 544 and an output of subsequent stage DSM 508 (DOUT1 and DOUT2, respectively) and sum them to provide a digital device output (DOUT). However, alternatively, similar to implementation 400 of FIG. 4, an inverse gain 1/G, such as illustrated as provided by digital gain block 426 in FIG. 4, can be implemented between subsequent stage DSM 508 and summing circuit 546 (in place of second gain amplifier 544) to produce an inverse gain (1/G). In such an implementation, second summing circuit 546 is configured to receive digital outputs from digital NCF 540 and subsequent stage DSM 508, via the inverse gain block and sum them to provide a digital device output. Regardless, calibration engine 538 may also provide calibration for the digital gain block 544 relative to analog output amplifier 542, such that they are matched. Calibration engine 538 may control digital gain block 544 to become equal to analog output amplifier 542. Thereby, matching transfer function of the first and second stages 502 and 504 (i.e. a frequency dependent function) via factoring out gain, via delay (frequency independent), and frequency response separately.

FIG. 6 is a schematic of an example combination low-pass filter 602 and first order all-pass filter 604 network 600 for implementation in a continuous-time input path of a pipelined continuous-time ADC for input path matching, in accordance with some embodiments of the present systems and methods. For example, combination low-pass and all-pass filter network 600 may be implemented as input delay circuits 312, 412 and 630 of pipelined continuous-time ADCs 300 and 400 and/or CTDSM 600 illustrated in FIGS. 3, 4 and 5, respectively. Illustrated passive filter network 600 includes low-pass filter 602 and all-pass filter 604. Illustrated low-pass filter 602 is a low pass series RC circuit, and illustrated all-pass filter 604 is an all pass series RC circuit.

The transfer function for a $1^{st}$ order all pass filter, such as illustrated all-pass RC filter 604 may be given by:

$$H(s) = \frac{I_{OUT}}{V_{IN}} = \frac{1}{R_2} \cdot \frac{1 - sC_2(R_2 - R_3)}{1 + sC_2 R_3} \quad \text{Eq. 1}$$

Where "s" is the Laplace transform frequency variable. To make this a $1^{st}$ order all pass, $R_2-R_3=R_3$, i.e. $R_2=2*R_3$. The above corresponds to the typical form of an all pass filter which is:

$$H(s) = \frac{1 - s\tau}{1 + s\tau} \quad \text{Eq. 2}$$

where $\tau=R_2 C_2$

A $2^{nd}$ order all pass filter may be represented by:

$$H(s) = \left(\frac{1-s\tau_1}{1+s\tau_1}\right) \cdot \left(\frac{1-s\tau_2}{1+s\tau_2}\right) = \frac{1-s(\tau_1+\tau_2)+s^2\tau_1\tau_2}{1+s(\tau_1+\tau_2)+s^2\tau_1\tau_2} \quad \text{Eq. 3}$$

While this may be implemented as a cascade of $1^{st}$ order sections, it may incur loading effects if the two $1^{st}$ order sections are not buffered.

The transfer function of low-pass/all pass combination filter 600 may be given as:

$$H(s) = \frac{1}{R_2} \cdot \frac{1 - s(\tau_2 - \tau_3)}{1 + s\tau_3} \quad \text{Eq. 4}$$

Wherein $\tau_1=R_1 C_1$, $\tau_2=R_2 C_2$ and $\tau_3=R_3 C_2$.

FIG. 7 is a schematic of another example combination low-pass filter 702 and second order all-pass filter 704 network 700 for implementation is a continuous-time input path of a pipelined continuous-time ADC for input path matching, in accordance with some embodiments of the present systems and methods. For example, combination low-pass and all-pass filter network 700 may alternatively be implemented as input delay circuits 312, 412 and 430 of pipelined continuous-time ADCs 300 and 400 and/or CTDSM 500 illustrated in FIGS. 3, 4 and 5, respectively. Illustrated passive filter network 700 includes low-pass filter 702 and all-pass filter 704. Illustrated low-pass filter 702 is also a low pass series RC circuit (the same as, or similar to, low-pass filter 502) and illustrated all-pass filter 704 is an all pass series RLC circuit. Thereby, FIG. 7 illustrates a passive solution to implementing a $2^{nd}$ order all pass filter (704). If $R_1 32 0$. the transfer function for alternative all pass RLC filter 704 may be given by:

$$H(s) = \frac{1}{R_2} \cdot \frac{1 - s(\tau_2 - \tau_3) + \frac{s^2}{\omega_2^2}}{1 + s\tau_3 + \frac{s^2}{\omega_2^2}} \quad \text{Eq. 5}$$

where, $\omega_2^2=1/(L_2 C_2)$.

Generally, for such filters:

$$H(s) = \frac{1}{R_2} \cdot \frac{1 - s(\tau_2 - \tau_3) + \frac{s^2}{\omega_2^2}}{\left(1 + s\tau_3 + \frac{s^2}{\omega_2^2}\right)(1 + 2s\tau_1) + \frac{R_1}{R_2}\left(1 + s(\tau_2 + \tau_3) + \frac{s^2}{\omega_2^2}\right)} \quad \text{Eq. 6}$$

FIG. 8 is a flowchart of example implementation 800 of input path matching in a pipelined continuous-time ADC in accordance with some embodiments of the present systems and methods. Therein, a magnitude and phase of a coarse resolution earlier stage sub-ADC of a pipelined continuous-time ADC is matched using an input delay circuit (312, 412) such as a passive filter network disposed in a parallel continuous-time signal path (310, 410) at 802. As discussed above, this passive filter network may be disposed in the continuous-time input path between an input of an analog input signal and a first summing circuit (318, 422) of the subject pipelined continuous-time ADC. At 804 process variations of the delay generated by the passive filter network are calibrated or otherwise adjusted for via at least one digital delay chain or line (414, 416) disposed in the coarse resolution path. Delay in the coarse resolution path is then calibrated at 806, using the digital delay line(s) to minimize residue from the the coarse resolution path. As also discussed above, the digital delay line(s) may be disposed between an output of an earlier stage continuous-time ADC (306, 406) and a sub-DAC (316, 420) coupled to the first summing circuit (318, 422), and between the earlier stage sub-ADC and a digital NCF (314, 418). As noted, the digital delay lines may be configured to be used to calibrate delay of output of the earlier stage sub-ADC provided to the sub-DAC and to the digital filter at 806 in accordance with process variations of the delay generated by the input delay circuit (passive filter network). This calibration may be carried out in accordance with process voltage and temperature, and the like via a calibration loop (330), such that residue monitored at the output of the first summing circuit is minimized.

Implementation 800 of input path matching may be implemented in a pipelined CTDSM in accordance with embodiments of the present systems and methods, wherein the earlier stage sub-ADC is an earlier stage sub-DSM (506) of a plurality of pipelined sub-DSMs. Therein, at 802, magnitude and phase of a coarse resolution earlier stage sub-DSM (506) of a pipelined CTDSM (500) is matched using an input delay circuit (530). At 804, process variations of the delay generated by the passive filter network are calibrated for, or otherwise adjusted for, via at least one digital delay chain or line (532, 534) disposed in the coarse resolution path. At 806, delay in the coarse resolution path is calibrated, using the digital delay line(s) to minimize residue from the the coarse resolution path. That is, the digital delay lines may be configured to be used to calibrate delay of output of the earlier stage sub-DSM (506) provided to a sub-DAC (526) and to a digital NCF (540) may be carried out in accordance with process voltage and temperature, and the like via a calibration loop (534), such that residue monitored at the output of a first summing circuit (536) is minimized.

FIG. 9 is a graph of in-band frequency response 900 for a half-of-full-scale (0.4 Vpp) combined input signal in a pipelined $3^{rd}$ order continuous-time ADC implementing the present systems and methods for input path matching, in accordance with some embodiments. Therein, the ADC employing the present systems and methods for input path matching is stable as evidenced by frequency response gradient 902. That is, a 60 dB/dec gradient, such as gradient 902, indicates correct operation of the subject ADC.

FIG. 10 is a graph of in-band frequency response 1000 for a 0.3 Vpp combined input signal in—the same pipelined continuous-time ADC as above, implementing the present systems and methods for input path matching, in accordance with some embodiments. Therein, the ADC employing the present systems and methods for input path matching is stable as evidenced by frequency response gradient 1002, in that a 60 dB/dec gradient, such as gradient 1002, indicates correct operation of the subject ADC Many modifications and other embodiments will come to mind to one skilled in the art to which this disclosure pertains having the benefit of the teachings presented in the foregoing descriptions, and the associated drawings. Therefore, it is to be understood that the techniques of this disclosure are not to be limited to the specific embodiments disclosed. Although specific terms are employed herein, they are used in a generic and descriptive sense only and not for purposes of limitation.

What is claimed is:

1. A method comprising:
comparing magnitude and phase of a coarse resolution signal path of a first stage sub-analog-to-digital converter (sub-ADC) in a pipelined continuous-time analog-to-digital converter (CT ADC) with magnitude and phase of a continuous-time signal path of the pipelined CT ADC to generate a residue magnitude and phase, using the continuous-time signal path comprising an input delay circuit, the residue magnitude and phase generated by a first summing circuit; and
varying a delay value of at least one digital delay circuit for reducing the residue magnitude and phase, the at least one digital delay circuit positioned at an output of the first stage sub-ADC and coupled to each of the first summing circuit and a second summing circuit, the second summing circuit positioned at an output of a second stage sub-ADC, the second stage sub-ADC coupled to an output of the first summing circuit.

2. The method of claim 1, wherein the input delay circuit is a passive filter network including at least one low-pass filter and at least one all-pass filter, the least one low-pass filter including at least one resistor-capacitor circuit and the at least one all-pass filter including at least one of: at least one resistor-capacitor circuit and at least one resistor-inductor-capacitor circuit.

3. The method of claim 1, wherein the input delay circuit is at least one of: a digitally controlled delay and a transmission line producing a fixed delay.

4. The method of claim 1, wherein the input delay circuit is positioned in the continuous-time signal path between an analog input signal of the pipelined CT ADC and the first summing circuit.

5. The method of claim 1, wherein the delay value of the at least one digital delay circuit is varied for reducing residue magnitude and phase over at least one of: process, temperature, and voltage variations.

6. The method of claim 5, wherein the at least one digital delay circuit is coupled to the first summing circuit via a sub-digital-to-analog converter, and coupled to the second summing circuit via a digital noise cancellation filter.

7. The method of claim 1, the pipelined CT ADC is an integrated circuit and is a pipelined continuous-time delta sigma modulator (CT DSM), and the first stage sub-ADC is a first stage sub-delta sigma modulator (sub-DSM) of a plurality of pipelined sub-DSMs.

8. The method of claim 1, wherein the at least one digital delay circuit comprises two digital delay circuits, the first digital delay circuit coupled to the first summing circuit and the second digital delay circuit coupled to the second summing circuit, the first digital delay circuit configured to have a delay different from a delay of the second digital delay circuit.

9. An apparatus for pipelined continuous-time analog-to-digital converters (CT ADCs) comprising:
an input delay circuit positioned in a continuous-time signal path of the pipelined CT ADC and coupled to a first summing circuit; and
at least one digital delay circuit positioned at an output of a first stage sub-analog-to-digital converter (sub-ADC) of a plurality of pipelined sub-ADCs, the at least one digital delay circuit coupled to each of the first summing circuit and a second summing circuit, the at least one digital delay circuit configured to vary a delay of the at least one digital delay circuit for reducing a residue magnitude and phase, the residue magnitude and phase representing a difference between magnitude and phase of a coarse resolution signal path of the first stage sub-ADC and magnitude and phase of a continuous-time signal path of the pipelined CT ADC, the first summing circuit configured to generate the residue magnitude and phase, the second summing circuit positioned at an output of a second stage sub-ADC, the second stage sub-ADC coupled to an output of the first summing circuit.

10. The apparatus of claim 9, wherein the input delay circuit is a passive filter network including at least one low-pass filter and at least one all-pass filter, the least one low-pass filter including at least one resistor-capacitor circuit and the at least one all-pass filter including at least one of: at least one resistor-capacitor circuit and at least one resistor-inductor-capacitor circuit.

11. The apparatus of claim 9, wherein the input delay circuit is at least one of: a digitally controlled delay and a transmission line producing a fixed delay.

12. The apparatus of claim 9, wherein the at least one digital delay circuit is coupled to the first summing circuit via a sub-digital-to-analog converter, and coupled to the second summing circuit via a digital noise cancellation filter.

13. The apparatus of claim 9, wherein the pipelined CT ADC is an integrated circuit and is a pipelined continuous-time delta sigma modulator (CT DSM), and the first stage sub-ADC is a first stage sub-delta sigma modulator (sub-DSM) of a plurality of pipelined sub-DSMs.

14. The apparatus of claim 9, wherein the at least one digital delay circuit comprises two digital delay circuits, the first digital delay circuit coupled to the first summing circuit and the second digital delay circuit coupled to the second summing circuit, the first digital delay circuit configured to have a delay different from a delay of the second digital delay circuit.

15. A pipelined continuous-time analog-to-digital converter (CT ADC) device comprising:
- a first stage sub-analog-to-digital converter (sub-ADC) of a plurality of pipelined sub-ADCs, the first stage sub-ADC configured to receive an analog input signal;
- a continuous-time signal path configured to receive the analog input signal, the continuous-time input path including an input delay circuit positioned before a first summing circuit; and
- at least one digital delay circuit positioned at an output of the first stage sub-ADC, the at least one digital delay circuit coupled to each of the first summing circuit and a second summing circuit, the at least one digital delay circuit configured to vary a delay of the at least one digital delay circuit for reducing a residue magnitude and phase, the residue magnitude and phase representing a difference between magnitude and phase of a coarse resolution signal path of the first stage sub-ADC and magnitude and phase of the continuous-time signal path, the first summing circuit configured to generate the residue magnitude and phase, the second summing circuit positioned at an output of a second stage sub-ADC of the plurality of pipelined sub-ADCs, the second stage sub-ADC coupled to an output of the first summing circuit.

16. The device of claim 15 further comprising:
- a digital noise cancellation filter coupled to an output of the at least one digital delay circuit;
- a sub-digital-to-analog converter (sub-DAC) coupled to an output of the at least one digital delay circuit;
- the first summing circuit further configured to couple to an output of the sub-DAC, the sub-DAC configured to be coupled to the output of the first stage sub-ADC;
- the second stage sub-ADC of the plurality of pipelined sub-ADCs coupled to an output of the first summing circuit; and
- the second summing circuit further configured to receive an output of the digital noise cancellation filter, the digital noise cancellation filter coupled to the at least one digital delay circuit.

17. The device of claim 15, wherein the input delay circuit is a passive filter network including at least one low-pass filter and at least one all-pass filter, the least one low-pass filter including at least one resistor-capacitor circuit and the at least one all-pass filter including at least one of: at least one resistor-capacitor circuit and at least one resistor-inductor-capacitor circuit.

18. The device of claim 15, wherein the input delay circuit is at least one of: a digitally controlled delay and a transmission line producing a fixed delay.

19. The device of claim 15, in which the pipelined CT ADC device is an integrated circuit and a pipelined continuous-time delta sigma modulator (CT DSM) device, and the first stage sub-ADC and the second stage sub-ADC are a first stage sub-delta sigma modulator (sub-DSM) and a second stage sub-DSM of a plurality of pipelined sub-DSMs.

20. The device of claim 15, wherein the at least one digital delay circuit comprises two digital delay circuits, the first digital delay circuit coupled to the first summing circuit and the second digital delay circuit coupled to the second summing circuit, the first digital delay circuit configured to have a delay different from a delay of the second digital delay circuit.

* * * * *